US005406272A

United States Patent [19]

Jang

[11] Patent Number: 5,406,272

[45] Date of Patent: Apr. 11, 1995

[54] TIME SETTING AND BACKUP DEVICE FOR A BATTERY-DRIVEN COMMUNICATIONS TERMINAL AND THE METHOD THEREOF

[75] Inventor: Jong-Jin Jang, Suwon, Rep. of Korea

[73] Assignee: SamSung Electronics Co., Ltd., Suwon, Rep. of Korea

[21] Appl. No.: 999,784

[22] Filed: Dec. 29, 1992

[30] Foreign Application Priority Data

Nov. 10, 1992 [KR] Rep. of Korea ........................ 20974

[51] Int. Cl.[6] ........................ G08B 5/22; G11C 14/00; G04B 47/00

[52] U.S. Cl. ........................ 340/825.44; 340/311.1; 365/228; 368/10

[58] Field of Search ........................ 340/825.44, 825.52, 340/825.48, 825.27, 311.1, 636; 455/38.4; 365/227, 228, 229; 368/10, 34

[56] References Cited

U.S. PATENT DOCUMENTS 4,323,987 4/1982 Holtz et al. ........................ 365/229
4,763,333 8/1988 Byrd ........................ 365/228
4,779,091 10/1988 Oyagi et al. ........................ 340/311.1
4,783,654 11/1988 Ichikawa ........................ 455/38.4
4,786,902 11/1988 Davis et al. ........................ 340/825.44
4,894,649 1/1990 Davis ........................ 340/825.44
4,905,187 2/1990 Beyers, Jr. ........................ 365/229
5,239,286 8/1993 Komatsuda ........................ 340/636
5,239,679 8/1993 Murai ........................ 340/311.1

*Primary Examiner*—Donald J. Yusko
*Assistant Examiner*—Mark H. Rinehart
*Attorney, Agent, or Firm*—Robert E. Bushnell

[57] ABSTRACT

A battery driven communications terminal, paging receiver, capable of an internal time backup function may be constructed with a manual backup operation in which the internal time is stored to a non-volatile memory in response to user selection of a BACKUP key as backed-up time information; and an automatic backup operation in which the internal time is stored to the memory when the voltage level of a battery is low. If a controller is reinitialized in response to restoration of the source voltage, the backed-up time information, stored as described above, is set as the internal time and displayed.

30 Claims, 4 Drawing Sheets

TIME SETTING AND BACKUP DEVICE FOR A BATTERY-DRIVEN COMMUNICATIONS TERMINAL AND THE METHOD THEREOF

TECHNICAL FIELD

The present invention relates to a battery-powered electronic device having a timed backup and time resetting function and to a method for controlling the device, and more particularly, to a paging receiver capable of preserving an internally-kept time in a nonvolatile memory if power to a time-keeping component should be interrupted.

BACKGROUND OF THE INVENTION

Commonly, portable personal telecommunications devices, such as paging receivers, continuously display an internally-kept time. Davis, U.S. Pat. No. 4,786,902 for example, describes a CONTROL INTERFACE FOR COMBINED WATCH AND PAGER FUNCTIONS that purports to display a watch output for a common display. The ability of the paging receiver to keep track of and to display the correct time however, is dependent upon the integrity of the paging receiver's power supply. For instance, if the battery of the paging receiver is replaced, a time-keeping component of the paging receiver will lose power and the paging receiver will forget the correct time. Consequently, in conventional designs of time keeping circuits, the internal time kept by the paging receiver will typically be reinitialized to twelve o'clock, for example. The integrity of the paging receiver's power supply is also threatened when the internal battery of the paging receiver is substantially drained of power and the paging receiver thereafter performs an alarm function because the power drain of the alarm function can cause intermittent power loss to the time-keeping component and can also cause the paging receiver to re-initialize its internal time.

SUMMARY OF THE INVENTION

It is therefore, an object of the present invention to provide an improved battery-powered communications terminal.

It is another object to provide an improved paging receiver and process for operating a paging receiver.

It is yet another object to provide a device and method for periodically checking a voltage of a battery in a communications terminal and backing-up the internal time when the voltage of the battery is low.

It is still another object to provide a device and method for storing time information in a communications terminal before a battery is replaced and restoring the time when power is restored.

It is still yet another object to provide a device and method for enhancing accuracy of time keeping despite intermittant and temporary loss of battery power.

It is a further object to provide a device and method for storing time information in a battery-powered communications terminal.

These and other objects may be achieved according to the principles of the present invention with a battery serving as a power source, a voltage monitoring device providing an indication of voltage level of the battery, and a controller maintaining an internal time, storing the internal time in a non-volatile memory when a low voltage signal is received from the voltage monitoring device, and setting the internal time in response to the time information stored in the memory if the controller is reset for example, due to a power failure.

The time information may be set pursuant to a process of determining the voltage level of a battery, storing an internally-kept time in a memory as time information when the voltage of the battery is low, and reestablishing the internally-kept time in response to the time information stored in the memory if power to a controller is interrupted, in order to thereby reinitialize the internal time of the controller.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
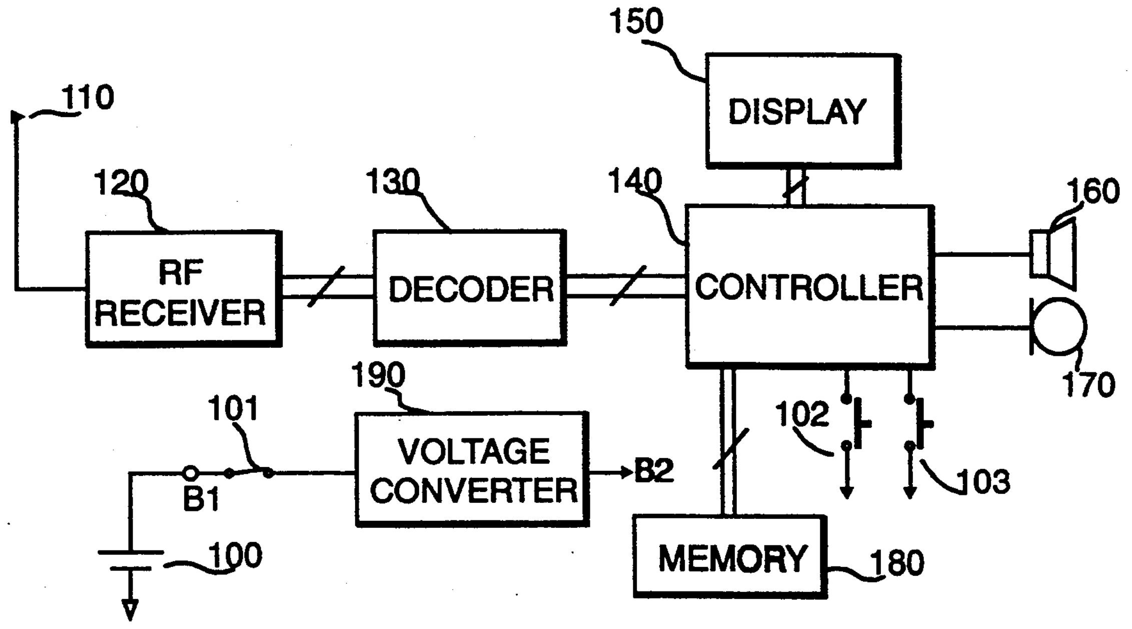
(PRIOR ART) FIG. 1
FIG. 1 is a block diagram of a conventional paging receiver.

Turning now to the drawings, FIG. 1 is a block diagram illustrating the internal configuration of a conventional design for a paging receiver. A radio frequency (RF) receiver 120 of FIG. 1 receives a radio frequency signal via an antenna 110. The RF receiver amplifies, frequency-converts, filters, demodulates, and wave shapes the received radio frequency signal to generate binary data indicative of a paging message contained in the radio frequency signal. A decoder 130 decodes the binary data from the RF receiver to generate decoded data which is provided to a controller 140. A display 150 displays the received paging message and information regarding the status of the paging receiver under control of the controller 140. A voltage converter 190 provides a supply voltage from a potential supplied by a battery 100 to the controller 140 via a terminal B1. A power switch 101 is coupled between the voltage converter 190 and the battery to enable a user to turn off the paging receiver by disconnecting the battery. A memory 180 stores an inherent address unique to each paging receiver which enables the individual paging receivers to distinguish paging messages intended for their users from all of the paging messages broadcast on a particular network.

The controller 140 is responsible for the overall operation of the paging receiver. Specifically, the controller 140 compares the inherent address supplied by the memory to address portions of the received paging messages to determine their intended destination by comparing the address components of the received paging messages with the inherent address for identical coincidence. If the controller 140 determines that the paging message is intended for the paging receiver's particular user, the controller controls an alarm function to notify the user of receipt of the paging message. The controller also controls the display 150 to exhibit the received paging message, a visual representation of an internally-kept time, and a visual indication of the status of the paging receiver.

The paging receiver is provided with a number of keys which enable a user to enter various commands to the paging receiver. Specifically, user selection of a READ key 102 indicates that the received message, stored in the controller 140, should be displayed on the display 150. Selection of a TIME SET key 103 places the controller in mode in which an internal time kept by the controller can be changed to the current time.

The alarm function includes two methods for signaling receipt of the paging message to the user. First, a buzzer 160 call be driven to provide an audible signal to a user. Additionally, a vibrator 170 can be driven to vibrate the housing of the paging receiver to provide a tactile signal. The paging receiver utilizes these two alarm devices to provide for two alarm modes. In a normal mode, the buzzer 160 generates an audible sound. However, in a silent mode the buzzer 160 is disabled and the vibrator rattles, or vibrates, the paging receiver's housing to indicate the reception of a message and thereby communicate the occurrence of that reception to the user.

Figure 2:
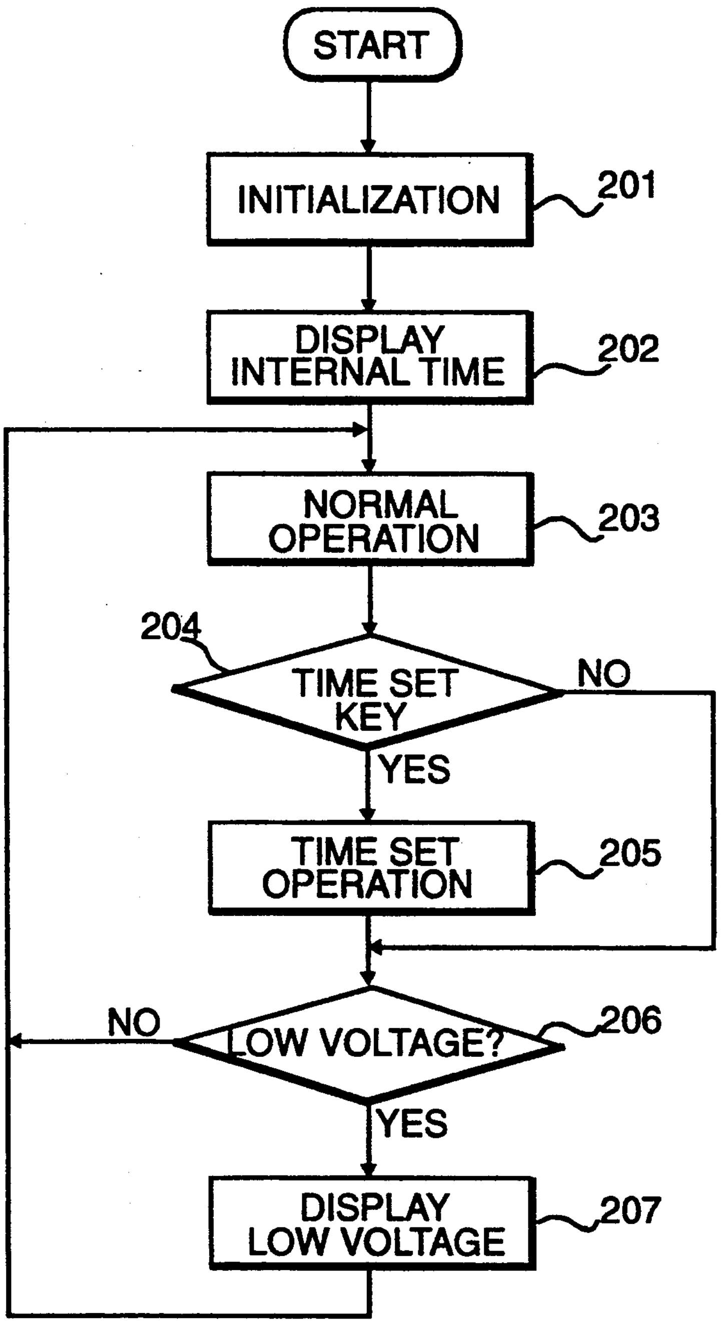
(PRIOR ART) FIG. 2
FIG. 2 is a flow chart of a conventional time setting function.

A typical overall sequential operation of the above-described paging receiver will now be described with reference to FIG. 2. When the paging receiver is first turned on an initialization step 201 is performed in which the internal time of the paging receiver is reset to a predetermined time such as 12:00 A.M. In step 202, a visual representation of the internal time is displayed. Next, a normal operation step 203 is performed. The normal operation step incorporates all of other general functions of the paging receiver including detecting receipt of a paging message, processing of the paging message if one exists, and maintaining the internal time. At step 204, a determination of whether the user has selected the TIME SET key is made. If the TIME SET key was selected, then a time set operation is performed in which user selection of the TIME SET key and the READ key are interpreted to enable a user to change the internal time of the paging receiver to the correct time. After termination of the time set mode or after checking step 204 if the TIME SET key was not selected, a "low voltage" check of the voltage of the battery 100 is made during step 206 to determine whether the battery is in a low voltage state. On the basis of whether the battery is determined to be in a low voltage state, an indication of the low voltage state is displayed on the display is performed during step 207 before the program returns to once again perform step 202.

The above-described conventional device and method suffer from the drawback that the internal time can be inadvertently reset during the paging receiver's operation. This can come about either of two ways. First, if the power of the battery has been substantially drained and the buzzer or vibrator is driven in response to receipt of a paging message, the large current requirements of these components causes the voltage of the battery to drop below a voltage necessary to power the controller 140. When the voltage to the controller drops below this level, the controller is unable to maintain the correct time and returns to perform step 201. The internal time can also be inadvertently reset while removing and replacing battery 100. The exchange of the old battery for a new replacement interrupts the power to the controller so that when power is reestablished to the controller, the internal time is reset. Consequently, the conventional paging receiver is cumbersome to the extent that a user must periodically reprogram the receiver with the correct time.

Furthermore, the conventional device and method suffers from the additional drawback that an audible alarm to indicate a low battery voltage is not a workable alternative. If the battery voltage is low, there is insufficient power in the battery to drive the buzzer and also ensure that the controller has adequate power. Therefore, notice to the user of the low battery voltage can only be provided via the visual display 150, which is a less effective mode than an audible alarm.

Figure 3:
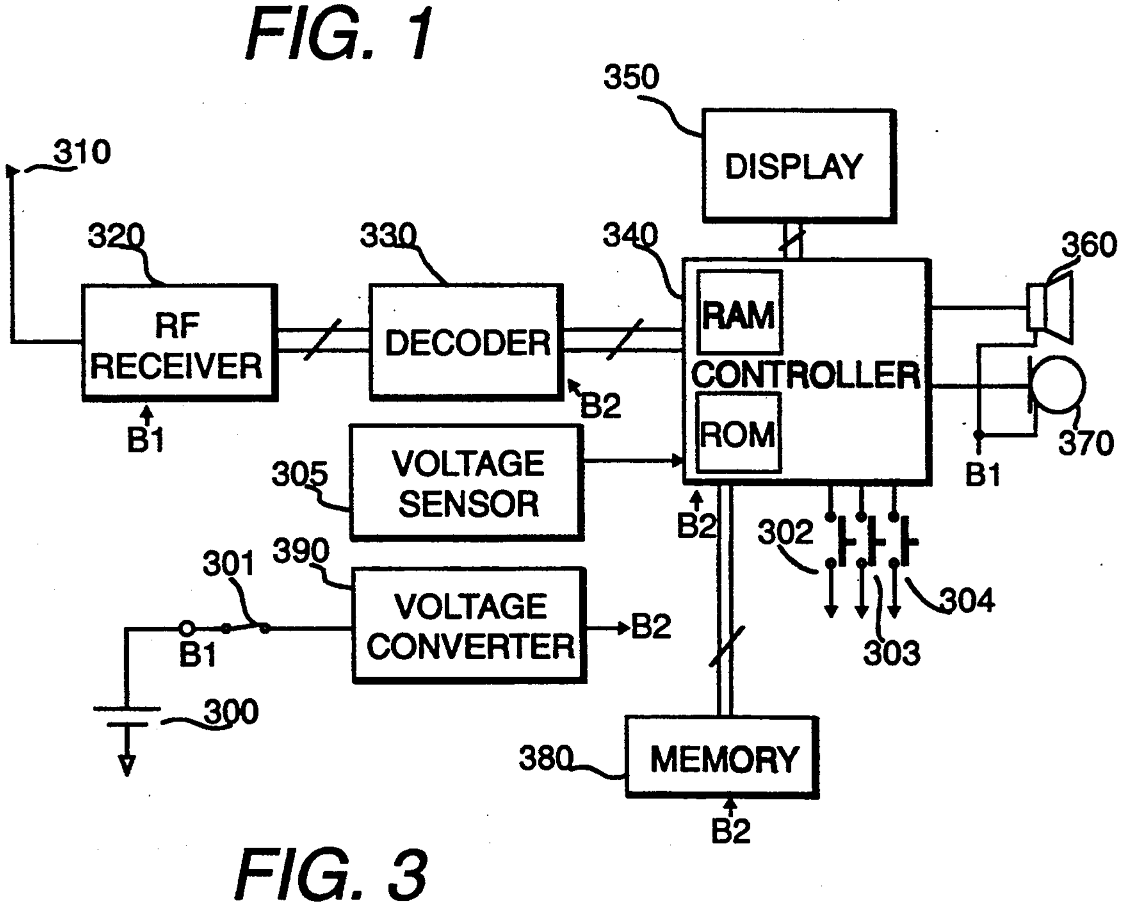
FIG. 3 is a block diagram of a paging receiver for explaining a time setting process performed according to the principles of the present invention.

Referring now to FIG. 3, a block diagram illustrates the internal configuration of a paging receiver constructed according to the principles of the present invention. A radio frequency (RF) receiver 320 of FIG. 3 receives a radio frequency signal via an antenna 310. The RF receiver amplifies, frequency-converts, filters, demodulates, and wave shapes the received radio frequency signal to generate binary data indicative of a paging message contained in the radio frequency signal. A decoder 330 performs preamble detection and word synchronization detection on the binary data from the RF receiver and also decodes the binary data to generate decoded data which is provided to a controller 340. A visual display 350 operates under control of controller 340 to display the received paging message and information regarding the status of the paging receiver. A voltage converter 390 provides an operating voltage from a potential supplied by a battery 300. A power switch 301 coupled between the voltage converter 390 and the battery enables a user to turn off the paging receiver by disconnecting the battery.

A memory 380 is divided into two portions. A first portion stores an inherent address unique to each paging receiver which enables a particular paging receiver to distinguish paging messages intended for its user from all of the paging messages broadcast on a particular network. A second portion stores time information under the control of the controller 340. The memory 380 may be, for example, a complimentary metal oxide semiconductor (CMOS) electrically erasable programmable read-only memory (EEPROM) and is non-volatile. That is, memory 380 retains stored data despite a loss of energy from battery 300.

Controller 340 is responsible for the overall operation of the paging receiver such as providing an alarm function to notify a user of receipt of a paging message, maintaining the internal time, and controlling the display 150 to exhibit the received paging message, a visual representation of an internally maintained time, and status of the paging receiver. Additionally, controller 340 compares the inherent address that is read from memory 380 with address components of received paging messages in order to determine their destination. Controller 340 is four-bit one-chip microprocessor and may comprise a random access memory RAM and a read-only memory ROM. The RAM stores the internal time, the inherent address provided by the memory 380, and the received paging message. During an initialization of the receiver, the inherent address and the time information is read out from the memory 380 and into the RAM in the controller 340.

A number of keys are provided on the paging receiver to enable a user to enter various commands. Specifically, user selection of a READ key 302 enables a received paging message, stored in the controller 340, to be displayed on the display 350. Selection of a TIME SET key 303 places the controller in a mode in which a user can change the internal time kept by the controller to the correct time. The paging receiver also has a BACKUP key 304.

The alarm function includes two methods for signaling receipt of the paging message to the user. A buzzer 360 provides audible signals, and a vibrator 370 vibrates the housing of the paging receiver to provide a tactile signal. The paging receiver utilizes these two alarm devices, both powered by energy received from battery 30 via terminal B1, to provide for two alarm modes. In a normal mode, the buzzer 360 generates an audible sound. In a silent mode however, the buzzer 360 is disabled and the vibrator vibrates the paging receiver's housing to indicate the reception of a message having an address identical to the inherent address of the receiver.

The components of the paging receiver are powered either directly from battery 300 or through voltage converter 390. Since the buzzer 360, the vibrator 370, and radio frequency receiver 320 require large currents and are not as sensitive to changes in voltage of the battery, these components may be powered directly by the battery 300 at voltage source terminal B1. The controller 340, memory 380, and decoder have CMOS type circuits and consequently are more sensitive to changes in voltage, they should be powered by the voltage converter at voltage source terminal B2.

A voltage sensor 305 checks the voltage level provided by the battery 300 to determine whether its voltage level is normal or is low, and supplies a voltage signal indicative of this determination to the controller 340. The voltage sensor can be a comparator which determines a low voltage state by comparing a reference voltage (for instance, set as a threshold voltage) to the voltage of the battery 300 as the first power source at terminal B1. Alternatively, the voltage sensor can be analog-to-digital converter which converts the voltage of the first power source terminal into a digital data signal that is provided to the controller 340, and reference data stored within controller 340 is used to determine the existence or absence of a low voltage state from the digital data signal.

Controller 340 performs a time-backup operation in response to a number of circumstances. First, if the voltage sensor 305 senses a low voltage, the internal time is automatically stored in the second portion of the memory 380. Additionally, if the BACKUP key 304 is selected by the user, for example, before replacement of the battery, the controller also stores the internal time in the second portion of the memory 380. The manner in which the time-backup operation is achieved in the paging receiver is described in detail, hereinbelow.

Figure 4:
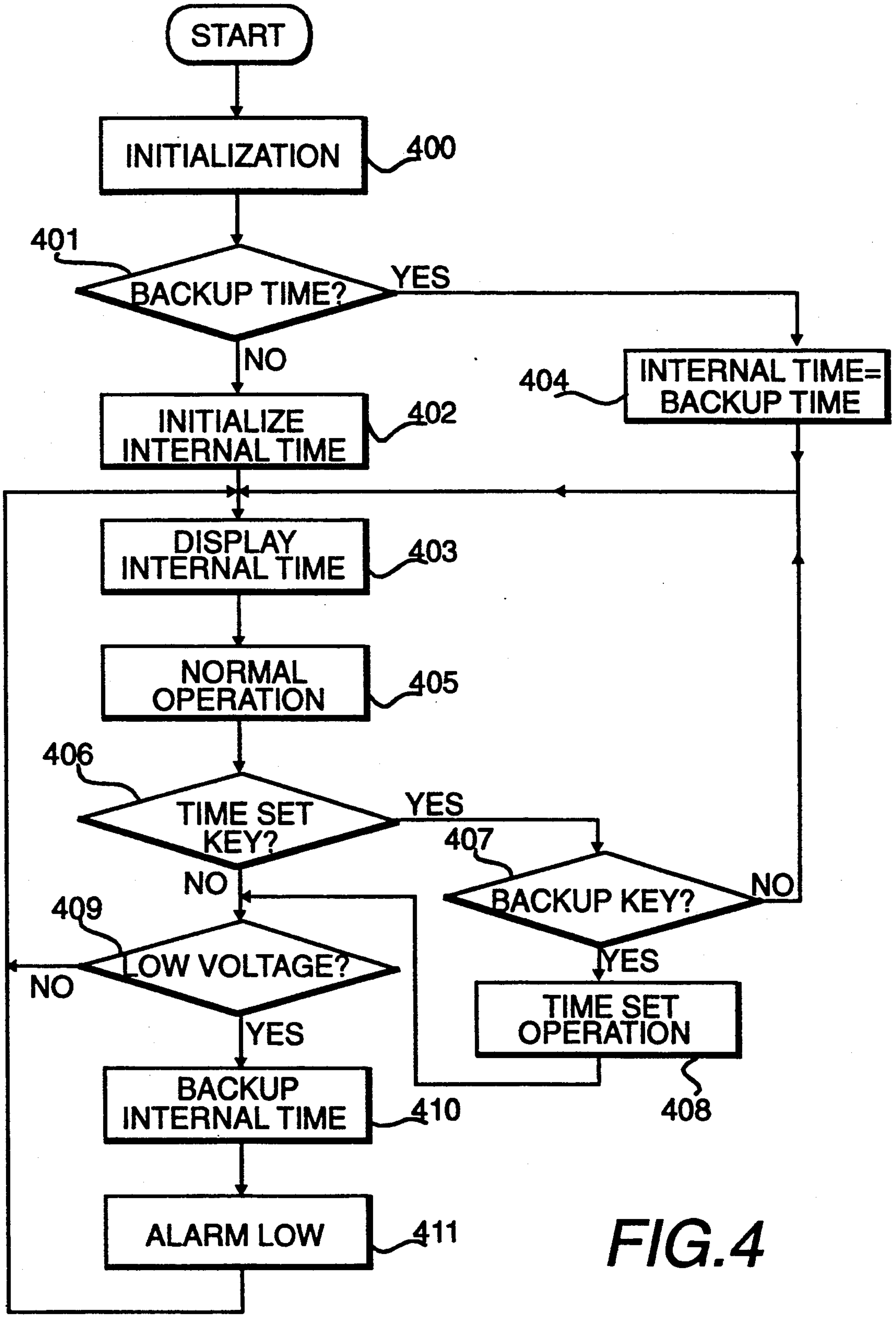
FIG. 4 is a flow chart of a first embodiment of a time setting function performed according to the principles of the present invention.

A first embodiment of a general overall sequential operation of the above-described inventive paging receiver will now be described with reference to FIG. 4. First, when the power is provided to the controller 340 by closing switch 301, an initialization operation 400 is performed. The initialization operation includes the initialization of the decoder 330 and the reading of the inherent address from the first portion of the memory 380 and backed-up time information from the second region which are then stored in the RAM within the controller. After the initialization operation, a determination is made as to whether backed-up time information exists, in step 401. If the controller determines at step 401 that backed-up time information does not exist in memory 380, then step 402 is performed in which the internal time is initialized to 12:00 A.M., for example. If, however, controller 340 determines that backed-up time information does exist in memory 380, the backed-up time is incremented by a predetermined time interval and is set as the internal time in step 404. After either step 402 or 404, a visual representation of the internal time is then displayed on visual display 350 in step 403.

The backed-up time is increased by the predetermined time interval to compensate for the time the controller did not receive power because, for example, the battery 300 was being replaced. A good estimate of the predetermined time interval would be sixty seconds which would provide a user with adequate time to replace the battery. If, however, the back-up time is a result of an intermittent power loss to the controller due to the driving of the buzzer, for example, then a much smaller predetermined time interval would be appropriate.

After the display of the internal time, step 405 representing the normal operations of the paging receiver, is performed. These normal operations include checking for receipt of a paging message. Additionally, the normal operations performed as part of the step 405 may include all of the other general functions of the paging receiver such as the processing of a paging message if one exists, and maintaining the internal time. If a message is received, then a comparison of the address of received paging message with the inherent address stored in the controller's RAM is made to determine whether the two addresses are identical. When these two addresses are identical, controller 340 stores the received paging message in the RAM inside the controller 340, displays the paging message on the visual display 350, and operates either the buzzer 360 or the vibrator 370 in dependence upon whether the alarm mode previously selected is the normal mode or the silent mode, respectively.

After performing the normal operations, selection of the TIME SET key 303 is determined at step 406. If the TIME SET key is selected, the controller enters a stand-by state to wait for selection of the BACKUP key 304 in step 407 and also controls the display portion 350 to display a visual indication of a time set operation. At this time, if the BACKUP key 304 is not selected within a period for a predetermined wait time or if a key other than the BACKUP key is selected, the controller returns to perform step 403 to again display the internal time. If the BACKUP key 304 is selected within the period of the predetermined wait time, then the controller performs a time set operation in which, generally, the selection of the BACKUP key 304 selects the digits of the displayed time value to be changed whereas operation of the TIME SET key 303 increments the selected digits.

Specifically, the time set operation 408 is performed as follows when the internal time is in the initialized state because no backup time information existed. When it is determined that the BACKUP key 304 was selected in step 407, the controller 340 enables an A.M./P.M. selection mode and an "A" is displayed on the display 350. The "A" signifies A.M. and a "P" would signify P.M. At this point, each selection of the TIME SET key toggles the display 350 between display of the "A" and display of the "P". If the current time was in the morning, the user would not need to select the TIME SET key 303 since the display would already be indicative of a time in the A.M., for instance.

Selecting the BACKUP key 304 while the controller is in the A.M./P.M. selection mode (regardless of whether the TIME SET key 303 was toggled), advances the time set operation to an hour set mode in which a "12" is displayed in the hour digits position of the display 350. Each selection of the TIME SET key 303 in the hour set mode increments the displayed hours by one hour, first to "1" then "2", and so on. Once the proper hour is set and the BACKUP key 304 is again selected, the hours are set and the time set operation advances to a ten-minute digit mode in which a "0" is placed in the ten-minute digit of the display 350. In the ten-minute digit mode, each selection of the TIME SET key 303 increments the number displayed in the ten-minute digit. Once the proper digit is displayed in the ten-minute digit, the user selects BACKUP key 304 setting the ten-minute digit and enabling a one-minute digit mode in which a "0" is displayed in the one-minute digit. Here, once again, if the TIME SET key 303 is selected, the one-minute digit is incremented each time the key is selected. Finally, the time set operation is terminated, thereby setting the entire time by pressing the BACKUP key 304 during the one-minute digit mode.

A specific example of the time set operation will now be provided. When internal time of the paging receiver is "12:00 AM" and the user wishes to change the internal time to "3:25 PM", the TIME SET 303 key and the BACKUP key 304 should be selected as follows: First, the TIME SET key 303 is selected to advance the program control of the controller 340 to step 407, the display is also controlled to display a visual indication of the time set operation such as "TIME SET". Next, the BACKUP key 304 is first selected to enable the change of the internal time from A.M. to P.M., during the A.M./P.M. selection mode. The display indicates that the A.M./P.M. state of the internal time may be changed by blinking the currently displayed "A". Then the TIME SET key 303 is selected to actually change the internal time from A.M. to P.M. When the TIME SET key 303 is selected, the display is also changed from displaying a blinking "A" to displaying a blinking "P". At this point the displayed time is "12:00 PM." Change of the hours digits is enabled by next again selecting (e.g., as by pressing) the BACKUP key 304 which causes the display 340 to display a blinking "12" indicating the hour set mode. The user should then select (e.g., by pressing) the TIME SET key 303 three times to increment the hours digits to a "3". The hours digit is then set by selecting the BACKUP key 304 which also enables changing of the ten-minutes digit which is indicated by the blinking of the "0" of the ten-minutes digit of the display during, the ten-minute digit mode. The TIME SET key 303 should then be selected twice by the user to increment the ten-minutes digit to "2". Once this is accomplished, BACKUP key 304 is selected for a third time in order to set the "2" and also to enable changing of the one-minute digit; this is done by placing the "0" in a blinking state during the one-minute digit mode. Finally, the TIME SET key 303 is selected five times so that the display shows a "5" as the one-minute digit of the display portion 350. At this time, the internal time will be automatically set to the enter "3:25 PM" value after a predetermined time period or manually by again selecting the BACKUP key 304. Consequently, the time of "12:00 AM" is changed and set to "3:25PM".

After the termination of the time set operation or if the TIME SET key 303 was determined to not have been selected at step 406, the controller 340 checks in step 409 a voltage signal received from the voltage sensor 305 and determines whether the voltage signal is indicative of a low voltage state of the battery 300. If the voltage of the battery is in a normal voltage state, step 403 is performed to again display the internal time. If the battery 300 is in a low voltage state however, the present internal time as kept by the controller 340 is stored into the second region of memory 380 in step 410 as the backed-up time information. Since memory 380 is non-volatile, the backed-up time information will not be lost even if power is interrupted to the controller while replacing battery 300 or by opening switch 301. Therefore, if power should be interrupted to controller 340 and cause controller 340 to perform the initialization step 400, the internal time will be set in response to the backed-up time information in step 404. Consequently, the internal time can be quickly adjusted in the set time operation if the internally kept time, as modified by the predetermined time interval, does not correspond to the correct time.

After the internal time is stored as backed-up time information in step 410, the controller performs an alarm function in step 411 in which the buzzer 360 is driven regardless of the present alarm mode, since the vibrator 370 has a relatively larger current consumption. Accordingly, when the battery 300 is in a low voltage state, even if an alarm mode is a silent mode, an audible signal is provided by the buzzer 360. If the driving of the buzzer 360 creates an intermittent power interruption to the controller however, the correct time will not be lost since the internal time has been backed-up. After the audible signal is generated, step 403 is again performed to display the internally kept time.

As described above, the method shown in FIG. 4 is recursively performed automatically, and the internal time is automatically backed-up when the voltage of battery 300 is low, as represented by voltage sensor 305 indicating a low voltage state in step 409.

Figure 5:
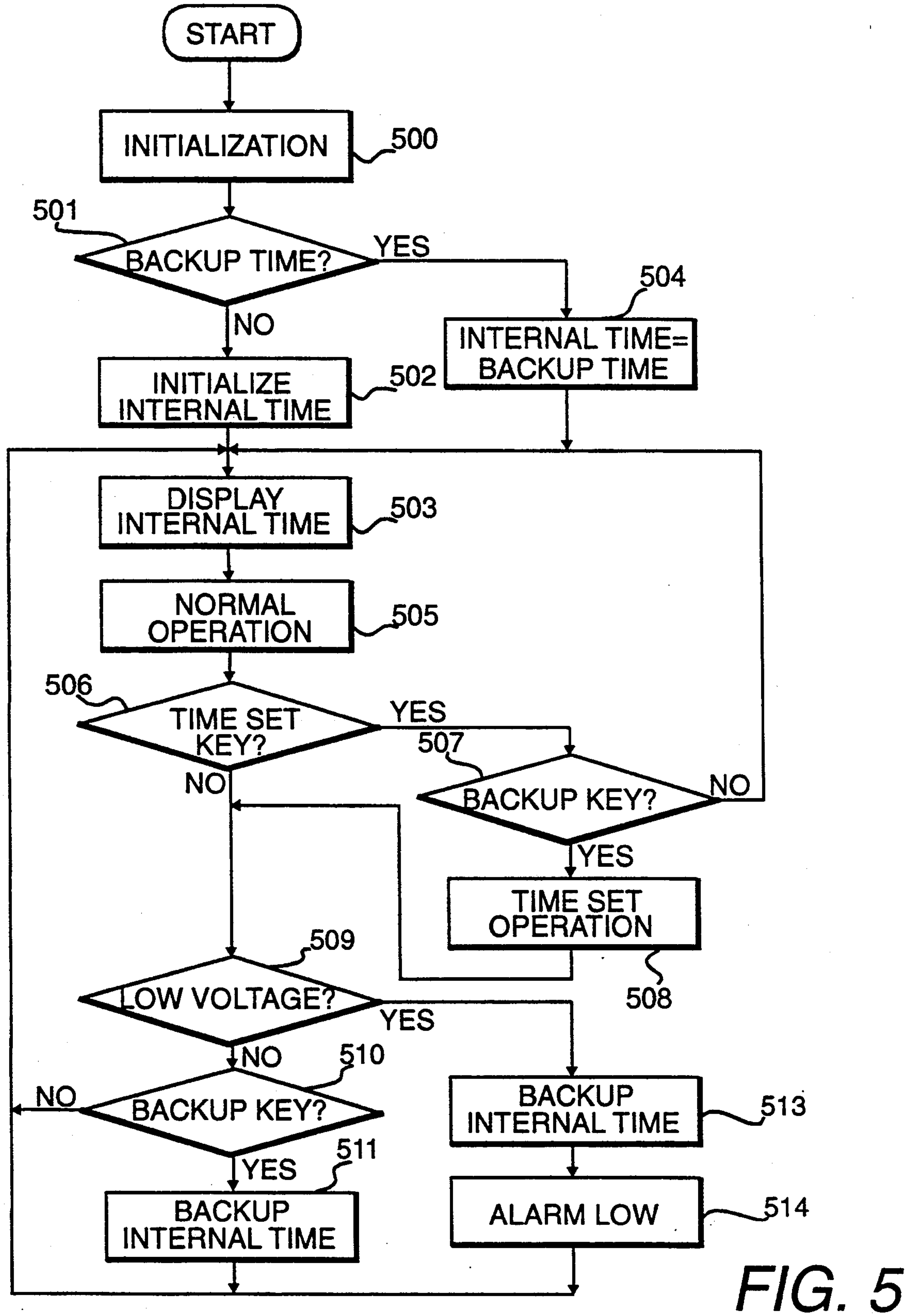
FIG. 5 is a flow chart of a second embodiment of a time setting function performed according to the principles of the present invention.

FIG. 5 illustrates a second embodiment of a sequential operation of the inventive paging receiver. This second embodiment provides the feature of allowing a user to manually back-up the internal time. This feature is convenient in the situation where the user wishes to replace the battery 300 when the battery is not in a low voltage state. Steps 500 to 508 of the second embodiment are the same as steps 400 to 408 of the first embodiment, and therefore, the explanation of those steps will not be repeated here.

After selection of the TIME SET key 303 at step 506 or the time set operation at step 508, the voltage signal from voltage sensor 305 is checked by controller 340 to determine whether the battery 300 is in a low voltage state in step 509. If the battery 300 is determined in step 509 to have a low voltage, the internal time is stored in step 513 as the backed-up time information in the second portion of memory 380 and an audible alarm is provided in step 514, as in steps 410 and 411 in the first embodiment. If, however, the battery is not in a low voltage state, the controller determines at step 510 whether the BACKUP key 304 has been selected. If the key 304 was selected, the internal time is stored in step 511 as the backed-up time information in the second portion of memory 380 before the program recursively returns to step 503.

In summary, the internal time is automatically stored in the memory 380 if the battery is in a low voltage state. Also, when the battery is in a normal voltage state and the BACKUP key 304 is selected, the internal time is stored in the memory 380. Accordingly, the time information storing function can be automatically or manually performed.

As described above, the circuit and alternative methods provide an improved time keeping function for a watch exhibiting enhanced recovery from loss of battery power and providing a reduction in the number of manual steps required for resetting the current time display after loss and subsequent restoration of battery power. A radio paging receiver or other communication terminal equipment using a battery and performing a time display function, before the battery is changed or when the voltage of the battery falls to a low voltage state, the currently displayed internal time can be automatically or manually backed-up in a nonvolatile memory. Accordingly, the necessity for manually reprogramming the internal time is entirely avoided or at least mitigated by only requiring minor adjustments or increments to the internal time. For example, the internal time need only be incremented from the backed-up time stored in the nonvolatile memory, rather than from the default display (e.g., "12:00 AM") time. Also, during performance of an initialization step, backed-up time information is increased by a predetermined time and then displayed, thereby compensating for a time in which the controller was not receiving power.

What is claimed is:

1. A radio paging receiver having an internal time backup function, said receiver comprising:

terminal means for receiving a supply voltage from a battery;

means for sensing a voltage level of said supply voltage, and for generating low voltage signals indicative of a low voltage state of said supply voltage;

a memory;

control means for maintaining an internal time, for storing said internal time into said memory as a back-up time in response to said low voltage signals, and for reading said back-up time from said memory and assigning said internal time a time value equal to said back-up time incremented by a predetermined time internal representative of a period of time said control means is deprived of said supply voltage in response to restoration of said supply voltage in response to restoration of said supply voltage; and means for displaying a visual representation of said internal time maintained by said control means.

2. A radio paging receiver as claimed in claim 1, further comprising alarm means controlled by said control means for audibly signaling a user in response to said low voltage signals.

3. A radio paging receiver as claimed in claim 1, wherein said sensing means comprises means for comparing a reference voltage with a voltage of said battery and generating said low voltage signals in dependence upon a result of the comparison.

4. A radio paging receiver as claimed in claim 1, further comprising:

means for converting broadcast signals into binary signals comprising an address component;

means for providing decoded data by decoding said address components; and said control means comparing said decoded data with stored address data.

5. A method for backing-up an internally-kept time of a battery-driven electronic device, said method comprising:

checking a voltage level of a battery providing a source voltage to said electronic device and determining whether said voltage level is in a low voltage state;

storing the internally-kept time into a memory as backed-up time data if said voltage level is determined to be in said low voltage state; and reading said backed-up time data from said memory and assigning said internally-kept time a time value equal to said backed-up time data said incremented by a predetermined time interval representative of a period of time when said battery is removed and physically replaced, said reading and assigning steps being performed after said source voltage to said electronic device has been restored to a level enabling operation of said electronic device, said source voltage being restored in response to said voltage level of said battery having been determined to be in said low voltage state.

6. A method as claimed in claim 5, wherein said predetermined time interval is stored by said controller prior to removal and replacement of said battery.

7. A method for backing-up an internally-kept time of a paging receiver, said method comprising:

storing said internally-kept time as back-up time data into a first memory in response to user entry of a back-up command;

periodically checking a voltage level of a battery providing a source voltage of said paging receiver and, determining whether said voltage level is in a low voltage state;

automatically storing said internally-kept time as said back-up time data into said first memory when said voltage level is in said low voltage state; and reading said backed-up time data from said first memory and assigning said internally-kept time a time value equal to said backed-up time data incremented by a predetermined time interval representative of a period of time that a controller of said paging receiver does not receive said source voltage, said reading and assigning steps being performed after said source voltage of said paging receiver has been restored to a level enabling operation of said paging receiver, said source voltage being restored in response to said voltage level of said battery having been determined to be in said low voltage state.

8. A method as claimed in claim 7, wherein said predetermined time interval is stored by said controller prior to said controller being deprived of said source voltage.

9. A method for backing-up and changing an internally-kept time of a paging receiver, said method comprising:

storing said internally-kept time as back-up time data into a first memory in response to user entry of a back-up command;

periodically checking a voltage level of a battery providing a source voltage of said paging receiver and determining whether said voltage level is in a low voltage state;

automatically storing said internally-kept time as said back-up time data into said first memory when said voltage level is in said low voltage state;

reading said backed-up time data from said memory and assigning said internally-kept time a time value equal to said backed-up time data incremented by a predetermined time interval representative of a period of time that a controller of said paging receiver does not receive said source voltage, said reading and assigning steps being performed after said source voltage of said paging receiver has been restored to a level enabling operation of said paging receiver, said source voltage being restored in response to said voltage level of said battery having been determined to be in said low voltage state; and in response to user selection of a first key, initiating a time set operation for setting said internally-kept time to a user selected set time.

10. A method as claimed in claim 9, wherein said time set operation comprises:

completely enabling said time set operation when a second key is sequentially selected after selection of said first key;

displaying an indication of one of an A.M. state and a P.M state of said set time and switching between display of said A.M. state and said P.M. state in response to user selection of said first key;

setting said set time to the displayed one of said A.M. state and said P.M. and displaying an hour digit in response to selection of said second key, and changing the displayed said hour digit in response to each selection of said first key;

setting said set time to said displayed hour digit and displaying a ten-minute digit in response to selection of said second key, and changing the displayed said ten-minute digit in response to each selection of said first key;

setting said set time to said displayed ten-minute digit and displaying a one-minute digit in response to selection of said second key, and changing the displayed said one-minute digit in response to each selection of said first key; and setting said internally-kept time to said set time and terminating said set time operation in response to a first to occur of elapse of a predetermined time and selection of said second key.

11. A method as claimed in claim 9, wherein said predetermined time interval is stored by said controller prior to said controller being deprived of said source voltage.

12. A method for setting and backing-up an internally-kept time of a radio paging receiver having a first key for enabling a time setting function and a second key for initiating a time storage function, said method comprising:

receiving paging messages, determining whether addresses of said paging messages match an address of said radio paging receiver, and performing an alarm function when said addresses of said paging messages match said address of said radio paging receiver;

storing said internally-kept time in a first memory in response to selection of said second key signal;

periodically checking a voltage level of a battery providing a source voltage to said radio paging receiver, and determining whether said voltage level is in a low voltage state;

automatically storing said internally-kept time as back-up time into said first memory when said voltage level is in said low voltage state;

reading said back-up time from said first memory and assigning said internally-kept time a value dependent upon said back-up time incremented by a predetermined time interval representative of a period of time that a controller of said radio paging receiver is being deprived of said source voltage, said reading and assigning steps being performed after said source voltage to said radio paging receiver has been restored to a level necessary for operation of said radio paging receiver, said source voltage to said radio paging receiver being restored in response to said voltage level of said battery having been determined to be in said low voltage state; and in response to user selection of a first key, enabling a time set operation for setting said internally-kept time to a user entered set time.

13. The method of claim 12, further comprised of assigning said internally-kept time a value equal to a sum of said back-up time and said predetermined time interval representative of said period of time that said controller of said radio paging receiver being deprived of said source voltage from said battery.

14. The method of claim 13, further comprised of storing said predetermined time interval prior to said controller being deprived of said source voltage.

15. A radio paging receiver having an internal time backup function, said receiver comprising:

means for supplying a supply voltage;

means for sensing a voltage level of said supply voltage, and for generating a low voltage signals indicative of a low voltage state of said supply voltage;

memory means for storing time information;

control means for maintaining an internal time, and for storing said internal time in said memory means as a back-up time in response to said low voltage signals, said control means also for reading said back-up time from said memory means and assigning said internal time a time value equal to said back-up time incremented by a predetermined time interval representative of a period of time while said control means is deprived of said supply voltage in response to restorsation of said supply voltage in response to restoration of said supply voltage; and means for displaying a visual representation of said internal time maintained by said control means.

16. The radio paging receiver of claim 15, further comprised of said sensing means comprising a comparator for generating said low voltage signal in response to a comparison of said voltage level of said supply voltage and a reference voltage.

17. The radio paging receiver of claim 15, further comprising said sensing means comprising an analog to digital converter for converting said supply voltage to a digital signal representative of said low voltage signal.

18. The radio paging receiver of claim 15, further comprised of said control means for checking said voltage level of said supply voltage and determining whether said voltage level is in said low voltage state.

19. The radio paging receiver of claim 18, further comprised of said control means storing said predetermined time interval prior to said control means being deprived of said supply voltage.

20. The radio paging receiver of claim 15, further comprised of said control means:

storing said internal time as said back-up time in said memory means in response to user entry of a back-up command;

periodically checking said voltage level of said supply voltage and determining whether said voltage level is in said low voltage state; and automatically storing said internal time as said back-up time in said memory means when said voltage level is in said low voltage state.

21. The radio paging receiver of claim 20, further comprised of said control means storing said predetermined time interval prior to said control means being deprived of said supply voltage.

22. The radio paging receiver of claim 15, further comprised of said control means:

storing said internal time as said back-up time in said memory means in response to user entry of a back-up command;

periodically checking said voltage level of said supply voltage and determining whether said voltage level is in said low voltage state;

automatically storing said internal time as said back-up time in said memory means when said voltage level is in said low voltage state; and in response to user selection of a first key, initiating a time set operation for setting said internal time to a user selected set time.

23. The radio paging receiver of claim 22, further comprised of:

a first key manually selectable by a user of the receiver;

a second key manually selectable by said user independent of said first key;

said control means:

completely enabling said time set operation when said second key is sequentially selected after selection of said first key;

displaying an indication of one of an A.M. state and a P.M state of said set time and switching between display of said A.M. state and said P.M. state in response to user selection of said first key;

setting said set time to the displayed one of said A.M. state and said P.M. state and displaying an hour digit in response to selection of said second key, and changing the displayed said hour digit in response to each selection of said first key;

setting said set time to said displayed hour digit and displaying a ten-minute digit in response to selection of said second key, and changing the displayed said ten-minute digit in response to each selection of said first key;

setting said set time to said displayed ten-minute digit and displaying a one-minute digit in response to selection of said second key, and changing the displayed said one-minute digit in response to each selection of said first key; and setting said internal time to said set time and terminating said set time operation in response to a first to occur of elapse of a predetermined time and selection of said second key.

24. The radio paging receiver of claim 22, further comprised of said control means storing said predetermined time interval prior to said control means being deprived of said supply voltage.

25. The radio paging receiver of claim 15, further comprised of:

a first key operable by a user;

a second key operable by said user to provide a second key signal when selected by said user;

means for receiving broadcast paging messages comprising address components; and said control means:

determining whether address components of said paging messages coincide with an address corresponding to said radio paging receiver, and activating an alarm function when said address components of said paging messages coincide with said address corresponding to said radio paging receiver;

storing said internal time in said memory in response to selection of said second key signal;

periodically checking said voltage level of said supply voltage and determining whether said voltage level is in said low voltage state;

automatically storing said internal time as said back-up time in said memory means when said voltage level is in said low voltage state; and in response to user selection of said first key, enabling the user to change said internal time.

26. The radio paging receiver of claim 25, further comprised of said control means storing said predetermined time interval prior to said control means being deprived of said supply voltage.

27. The radio paging receiver of claim 26, further comprised of said predetermined time interval being when said user replaces said means for supplying said supply voltage.

28. A method for backing-up an internally-kept time and informing a user of a low voltage state of a battery in a paging receiver, said method comprising:

periodically checking a voltage level of said battery providing a source voltage of said paging receiver;

automatically storing said internally-kept time as back-up time data into a memory before providing an audible low-voltage alarm when said voltage level of said battery is in said low voltage state;

performing an initialization of values stored by the paging receiver upon restoration of said source voltage to the page receiver; and reading said back-up time data from said memory and assigning said internally-kept time a time value dependent upon said back-up time data incremented by a predetermined time interval representative of a period of time that a controller of said paging receiver does not receive said source voltage, said reading step performed during said initialization.

29. The method of claim 28, further comprised of said time value being equal to a sum of a value indicated by said back-up time data and a value indicated by said predetermined time interval.

30. The method of claim 29, further comprised of storing said predetermined time interval prior to said controller being deprived of said source voltage.

* * * * *